US012587211B2

(12) United States Patent
van der Klooster et al.

(10) Patent No.: US 12,587,211 B2
(45) Date of Patent: Mar. 24, 2026

(54) SYSTEM AND METHOD OF DIGITAL TO ANALOG CONVERSION WITH IMPROVED LINEARITY AND ACCURACY

(71) Applicant: NXP B.V., Eindhoven (NL)

(72) Inventors: Jan Daniël van der Klooster, Bergeijk (NL); Efraïm Nathanael Eland, Hoofddorp (NL)

(73) Assignee: NXP B.V., Eindhoven (NL)

( * ) Notice: Subject to any disclaimer, the term of this patent is extended or adjusted under 35 U.S.C. 154(b) by 84 days.

(21) Appl. No.: 18/614,272

(22) Filed: Mar. 22, 2024

(65) Prior Publication Data

US 2025/0300671 A1     Sep. 25, 2025

(51) Int. Cl.
H03M 3/00          (2006.01)

(52) U.S. Cl.
CPC ........... H03M 3/496 (2013.01); H03M 3/358 (2013.01)

(58) Field of Classification Search
CPC ........ H03M 3/338; H03M 1/682; H03M 3/50; H03M 3/358; H03M 3/502; H03M 3/02; H03F 3/2175
See application file for complete search history.

(56) References Cited

U.S. PATENT DOCUMENTS 7,432,841 B1 *  10/2008  Kinyua ................. H03M 3/414
                                                              341/143
9,325,340 B2     4/2016  Gonen et al.
                    (Continued)

OTHER PUBLICATIONS

Noli, Stefano et al. "$\Sigma\Delta$ Time Interleaved Current Steering DAC with Dynamic Elements Matching." © 2009 $52^{nd}$ IEEE International Midwest Symposium on Circuits and Systems, Cancun, Mexico. pp. 407-410, doi: 10.1109/MWSCAS.2009.5236068.
(Continued)

*Primary Examiner* — Mirza F Alam

(57)          ABSTRACT

A system and method of digital to analog conversion including modulating a digital value $D_{N-K}$ with an oversampling delta sigma modulator to provide an M-bit coarse quantized value $D_M$, in which $D_{N-K}$ comprises N–K least significant bits of an N-bit digital input value $D_N$ and in which quantization error may be shaped to a higher frequency above a signal band of interest, adding $D_M$ to a value $D_K$ to provide a select value $D_{KM}$ in which $D_K$ includes the K remaining most significant bits of $D_N$, and applying mismatch shaping of a total of at least $P=2^K$ elements of a P-element DAC per cycle based on $D_{KM}$ to provide an analog output value. The analog output value may be filtered with a low-pass filter to provide a filtered analog output value. An order of low-pass filtering may be one more than an order of modulating.

18 Claims, 6 Drawing Sheets

(56)                    References Cited

U.S. PATENT DOCUMENTS

| | | | | |
|---|---|---|---|---|
| 2002/0080053 A1* | 6/2002 | Brooks | ................ | H03M 3/502 |
| | | | | 341/143 |
| 2013/0201045 A1* | 8/2013 | Porret | .................. | H03M 3/338 |
| | | | | 341/143 |
| 2017/0077945 A1* | 3/2017 | Pagnanelli | ......... | H03F 3/45475 |
| 2017/0170840 A1* | 6/2017 | Zhao | ................... | H03M 1/1071 |

OTHER PUBLICATIONS

Fujimori, Ichiro et al. "A 1.5 V, 4.1 mW dual-channel audio delta-sigma D/A converter." In *IEEE Journal of Solid-State Circuits*, vol. 33, No. 12, pp. 1863-1870. Dec. 1998, doi: 10.1109/4.735525.

Neitola, Marko et al. "A Generalized Data-Weighted Averaging Algorithm." *IEEE Transactions on Circuits and Systems—II: Express Briefs*, vol. 57, No. 2, Feb. 2010. pp. 115-119.

Afzal, Nadeem et al. "Study of Modified Noise-Shaper Architectures for Oversampled Sigma-Delta DACs." *NORCHIP 2010*, Tampere, Finland, 2010. pp. 1-4, doi: 10.1109/NORCHIP.2010.5669461.

Pavan, Shanthi et al. "Mismatch-Shaping" in *Understanding Delta-Sigma Data Converters*. IEEE, 2017, pp. 136-141. doi: 10.1002/9781119258308.ch6.

Su, Shiyu et al. "A 12 bit 1 GS/s Dual-Rate Hybrid DAC With an 8 GS/s Unrolled Pipeline Delta-Sigma Modulator Achieving > 75 dB SFDR Over the Nyquist Band." In *IEEE Journal of Solid-State Circuits*, vol. 50, No. 4, pp. 896-907, Apr. 2015. doi: 10.1109/JSSC.2014.2385752.

Clara, M. et al. "A 1.5V 13bit 130-300MS/s Self-calibrated DAC with Active Output Stage and 50MHz Signal Bandwidth in 0.13μm CMOS." ESSCIRC 2008—34th European Solid-State Circuits Conference, Edinburgh, UK. 2008. pp. 262-265. doi: 10.1109/ESSCIRC.2008.4681842.

Noli, S., "ΣΔ Time Interleaved Current Steering DAC with Dynamic Elements Matching", MWSCAS '09, 52nd IEEE International Midwest Symposium on Circuits and Systems, ISBN: 978-1-4244-4479-3, Aug. 2, 2009.

* cited by examiner

EXAMPLE DWA IMPLEMENTATION OF DEM
(SHADED ELEMENTS REPRESENT THE
VALUE $D_{KM}$ FOR EACH CYCLE)

SYSTEM AND METHOD OF DIGITAL TO ANALOG CONVERSION WITH IMPROVED LINEARITY AND ACCURACY

BACKGROUND

Field

The present disclosure relates in general to digital to analog conversion (DAC), and more particularly to a system and method of performing digital to analog conversion with improved linearity and accuracy.

Description of the Related Art

A Digital to Analog Converter (DAC) is widely used in audio and radio frequency (RF) applications among other applications. For a conventional DAC the effective number of bits (ENOB) is mainly limited by non-linearity which is caused by mismatch in the analog elements of the multibit DAC. The linearity, and thus the ENOB, can be improved by increasing the size of the analog elements of the DAC. Increasing the size of the analog elements, however, quickly leads to large designs and puts a practical limit on the maximum achievable number of bits of a DAC.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A single-bit delta-sigma modulator (DSM) is inherently linear, but has a significant amount of quantization noise. A multibit DSM reduces quantization noise at the expense of reduced linearity. As described herein, a DSM is used to convert the lower LSBs of the digital input value for providing a 1- or 2-bit noise-shaped quantized value, which is summed with the MSBs of the digital input value to provide a sum value. The binary sum value is converted by dynamic element matching (DEM) to a thermometer value provided to a P-element DAC which provides a preliminary analog output value. The preliminary analog output value is filtered by a low-pass filter (LPF) to provide a final analog output value with improved linearity and accuracy, in which the LPF is configured to remove the shaped quantization noise introduced by the DSM.

Figure 1:
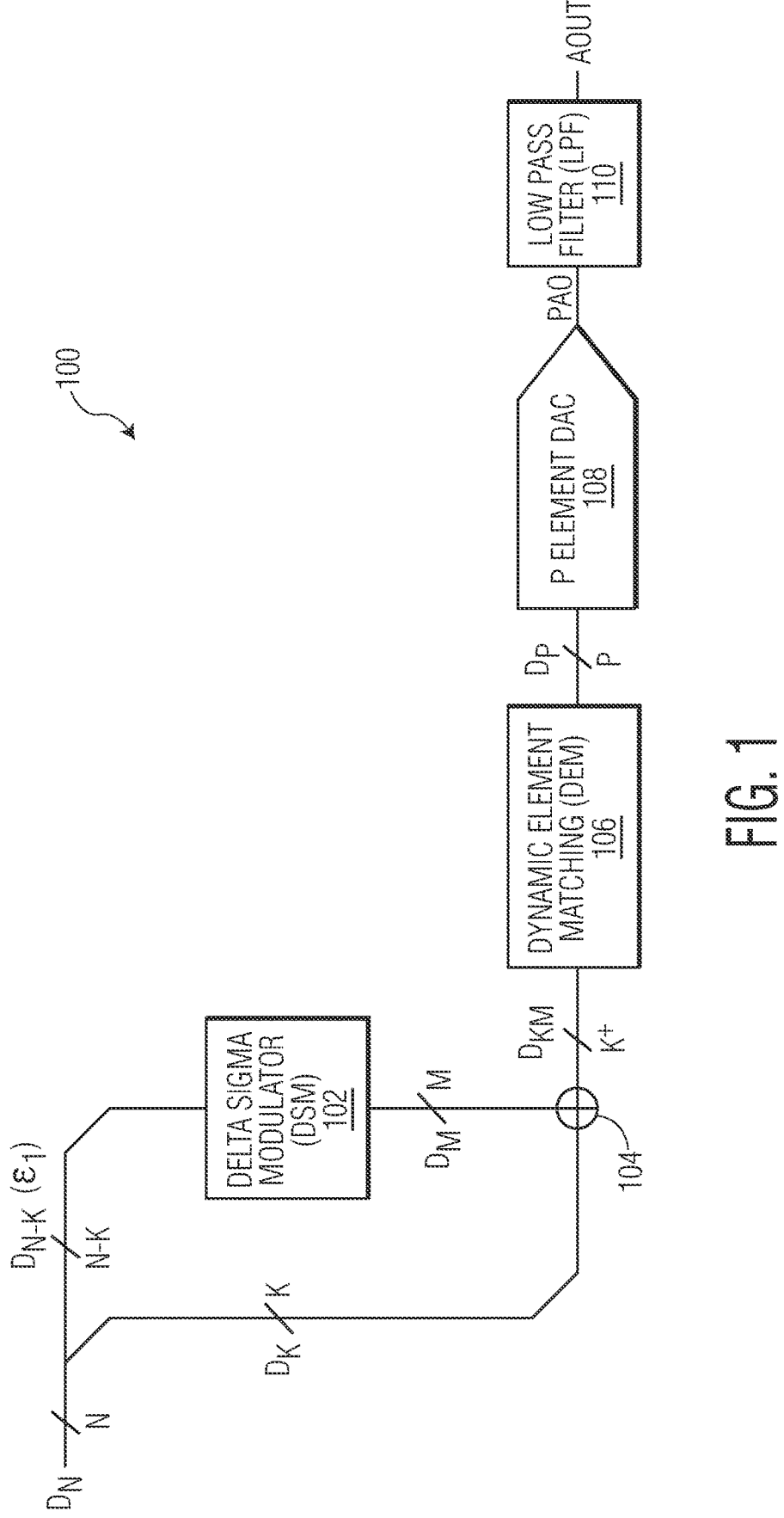
FIG. 1 is a simplified block diagram of a digital to analog converter (DAC) implemented according one embodiment with improved linearity and accuracy.

FIG. 1 is a simplified block diagram of a digital to analog converter (DAC) 100 implemented according one embodiment with improved linearity and accuracy. The DAC 100 includes a delta sigma modulator (DSM) 102, an adder 104, a dynamic element matching (DEM) circuit 106, a P-element DAC 108, and a low-pass filter (LPF) 110. The DAC 100 is configured to convert an N-bit digital input value $D_N$ to an analog output value AOUT, where N is an integer that depends upon the particular application in which the DAC 100 is used. In one embodiment, for example, N=20, although alternative values of N are contemplated that are less than or more than 20. The input value $D_N$ is separated into a coarse value $D_K$ and a fine value $D_{N-K}$, in which the coarse value $D_K$ includes the upper K most significant bits (MSBs) of $D_N$ and $D_{N-K}$ includes the remaining lower N–K least significant bits (LSBs) of $D_N$. K is also an integer that depends upon the value N, in which K may be significantly less than N. In one embodiment for N=20, for example, K=6 (in which N–K=14), although alternative values of K are contemplated that are more or less than 6.

The fine value $D_{N-K}$ is provided to an input of the DSM 102 having an output providing an M-bit quantized value $D_M$. M is an integer that is significantly less than N–K to reduce the number of bits. In one embodiment, for example, M is such that N>>K+M in order to reduce the integer value P, which is or otherwise corresponds with the number of elements of the DAC 108. In one embodiment, M is only 1 or 2 bits. The adder 104 adds the coarse input value $D_K$ and the quantized value $D_M$ to provide a sum value $D_{KM}$ having "K+" bits. It is noted that adding an M-bit value to a K-bit value does not necessarily mean that the sum has K+M bits. In fact, since K>M and M may have a small number of bits, such as only 1 or 2 bits, the number of bits $K^+$ of the sum may be K or K+1 bits depending upon K and M, in which $K^+$ is a simplified notation to reflect that the actual number of bits of the sum value $D_{KM}$ depends upon the particular implementation. The sum value $D_{KM}$ is provided to an input of the DEM circuit 106, which outputs a select or control value $D_P$ generally including P bits or P values. $D_P$ is provided to respective inputs of the DAC 108, which converts $D_P$ to a preliminary analog value PAO. PAO is provided to an input of the LPF 110, which filters out higher frequency noise above a target signal frequency band of PAO to provide the filtered analog output value AOUT.

In one embodiment, the DSM 102 has an order Q, where Q is a natural number, and total low-pass filtering of the DAC 100, including the LPF 110, has an order Q+1. If the DAC 108 does not otherwise include a first-order LPF, then the LPF 110 is a Q+1 order LPF. If, however, the DAC 108 does include low-pass filtering, such as a first-order LPF, then the LPF 110 may be a Q order LPF.

Figure 2:
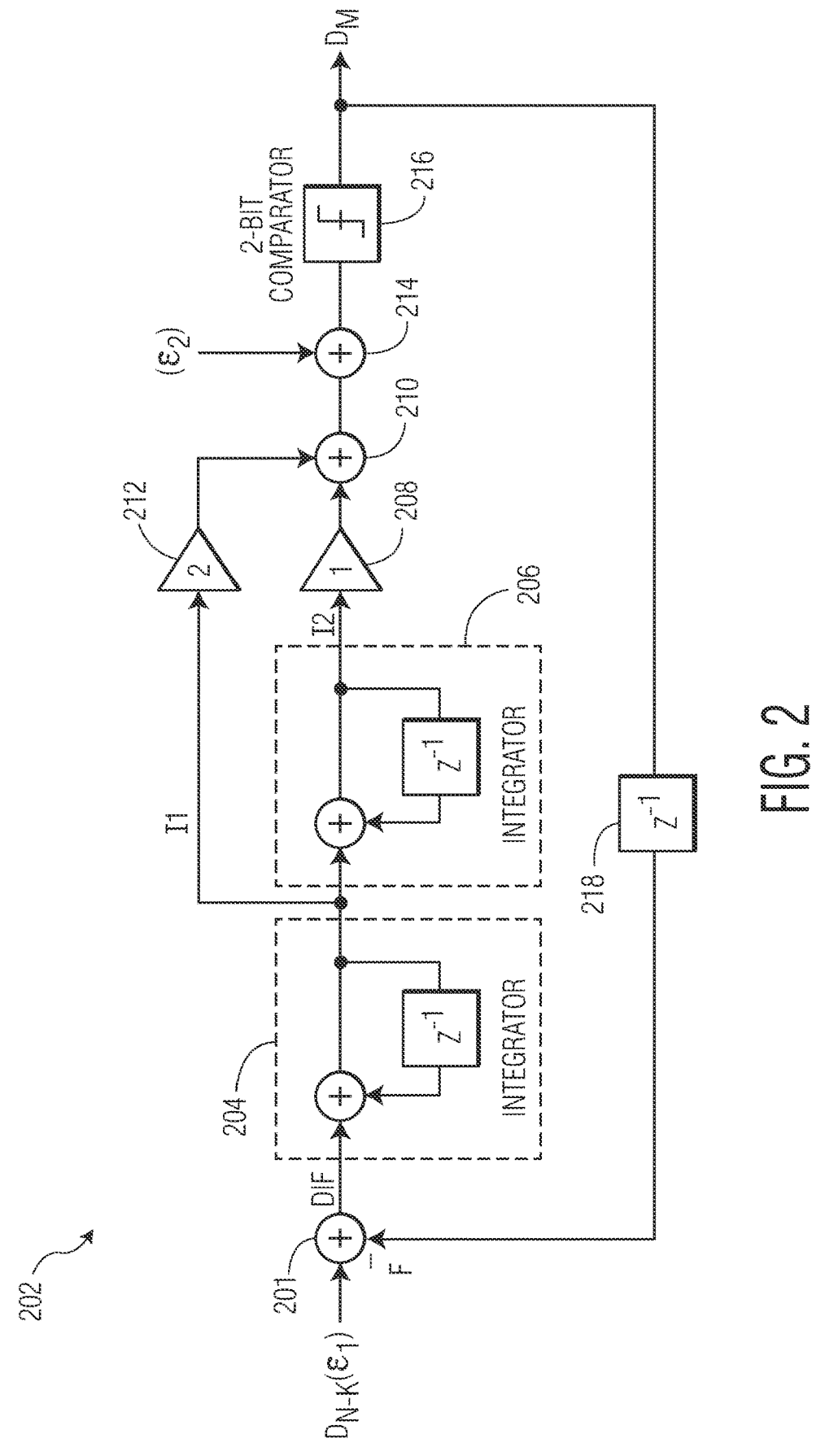
FIG. 2 is a simplified block diagram of a delta-sigma modulator (DSM) according to one embodiment for implementing the DSM of FIG. 1.

FIG. 2 is a simplified block diagram of a DSM 202 according to one embodiment for implementing the DSM 102. It is noted that the illustrated DSM 202 is exemplary only and that many different DSM implementations may be used. The illustrated DSM 202 is a multiple bit (multibit) DSM designed with Q=2 and operative to shape noise to higher frequencies outside a target signal frequency band of interest. The DAC 100 incorporates low-pass filtering, including the LPF 110, to filter out the higher frequency noise in PAO to provide the filtered output signal AOUT.

The fine value $D_{N-K}$, which may also be referred to as a quantization error $\varepsilon_1$ of the coarse input value $D_K$, is provided to an input of an adder 201, which subtracts a feedback value F from $D_{N-K}$ to provide a difference value DIF. DIF is provided to an input of a first integrator 204, which provides a first integrated value I1 to an input of a second integrator 206, which outputs a second integrated value I2. I2 is provided to an input of a first gain block 208 shown having a gain of 1, which has an output that is provided to an input of an adder 210. I1 is provided to an input of a second gain block 212 shown having a gain of 2, which has an output that is provided to another input of the adder 210. The gains of the gain blocks 208 and 212 are exemplary only and may be different depending upon the particular loop filter design. The adder 210 adds the outputs of the gain blocks 208 and 212 and provides the sum to an input of a quantizer shown as an "idealized" 2-bit comparator 216. A physical implementation of the comparator 216 adds another quantization error which is represented by an adder 214 receiving a second quantization error $\varepsilon_2$. Thus, the quantization error $\varepsilon_2$ is not actually added to the output of the adder 210 but instead represents the quantization error of the comparator 216. The comparator 216 has an output providing the $D_M$ value, which is fed back to an input of a $z^{-1}$ delay block 218, having an output providing the feedback value F to the other input of the input adder 201.

Integrators incorporated within the DSM 202 may be configured in any suitable manner, such as delaying or non-delaying integrators. In the illustrated embodiment, the integrators 204 and 206 are configured as non-delaying integrators. In the illustrated embodiment, each of the integrators 204 and 206 has an adder having a first input receiving the input value and an output providing the integrated value, which is fed back to an input of a $z^{-1}$ delay block, having an output provided to a second input of the adder of the integrator. Thus, the delayed output of the delay block is added to the input to provide the output integrated value. Other integrator configurations are contemplated. The comparator 216 is shown as a 2-bit comparator so that $D_M$ has 2 bits (i.e., M=2), although 1-bit comparators (e.g., M=1) or comparators in which M>2 are contemplated. In one embodiment, for example, M=2 in which the levels of $D_M$ at the output of the comparator 216 are −1, 0, 1, and 2.

The fine value $D_{N-K}$ (also known as the quantization error $\varepsilon_1$) is quantized into the $D_M$ value by the DSM 102 (e.g., the DSM 202) according to the following equation (1):

$$D_M = \varepsilon_1(STF) + \varepsilon_2(NTF) \qquad (1)$$

where STF is the signal transfer function of the conversion of the DSM and NTF is the noise transfer function of the DSM 102. The output $D_{KM}$ of the coarse and fine quantizers is summarized according to the following equation (2):

$$D_{KM} = D_N - \varepsilon_1 + \varepsilon_1(STF) + \varepsilon_2(NTF) = D_N + \varepsilon_1(STF - 1) + \varepsilon_2(NTF) \qquad (2)$$

When a DSM is used for the fine quantizer, an STF value of STF≈1 can be achieved for low frequencies, which causes the coarse quantization error to cancel. This strongly attenuates the quantization error of the coarse conversion. The quantization error $\varepsilon_2$ of the DSM 102, however, adds a conversion penalty. Nonetheless, this quantization error penalty is shaped to high frequencies by the NTF of the DSM 102 allowing it to be filtered by low-pass filtering at the output, which is performed, in full or at least in part, by the LPF 110. As previously noted, to reduce the number of elements of the DAC 108, the DSM 102 can be configured such that N>>M+ K.

In one embodiment, the number of elements P of the DAC 108 can be reduced significantly, achieving a significant reduction in area and switched elements compared to a Nyquist DAC. This reduction of the number of elements of the DAC 108 is a tradeoff with increased sampling frequency. The assumption STF≈1 only holds if the DAC elements controlled by M is equal to the DAC elements controlled by K, which is not the case with mismatch. As described herein, this assumption can be achieved by dynamic element matching (DEM), which shapes the signal power of the mismatch of the devices of the DAC 108. The DEM 106 cycles the elements of the DAC 108, both Nyquist and noise-shaped. In a first order configuration with a 1-bit DSM 102, $P=2^K$. In higher order configurations in which M>1, $P=2^{K+(M-2)}+2^{M-1}-1$. For one embodiment in which K=6 and M=2, P=65.

Besides element matching and using a sufficiently high oversampling ratio of the DSM 102 to enable STF=1 to hold, it is also desired to employ over-ranging in the DSM 102. This allows the DSM 102 to quantize $D_{N-K}$ when it is close to 0 or (normalized) 1. This may be implemented by making the positive output of the DSM 102 equal to the LSB+1 element of the coarse conversion $D_K$. The negative output of the DSM 102 is equal to −LSB of $D_K$, which is easily implemented since summing is done in the digital domain. Over-ranging gives the penalty that $2_{M-1}$ additional DAC elements are needed. For low values of M, however, this penalty is sufficiently small.

Figure 3:
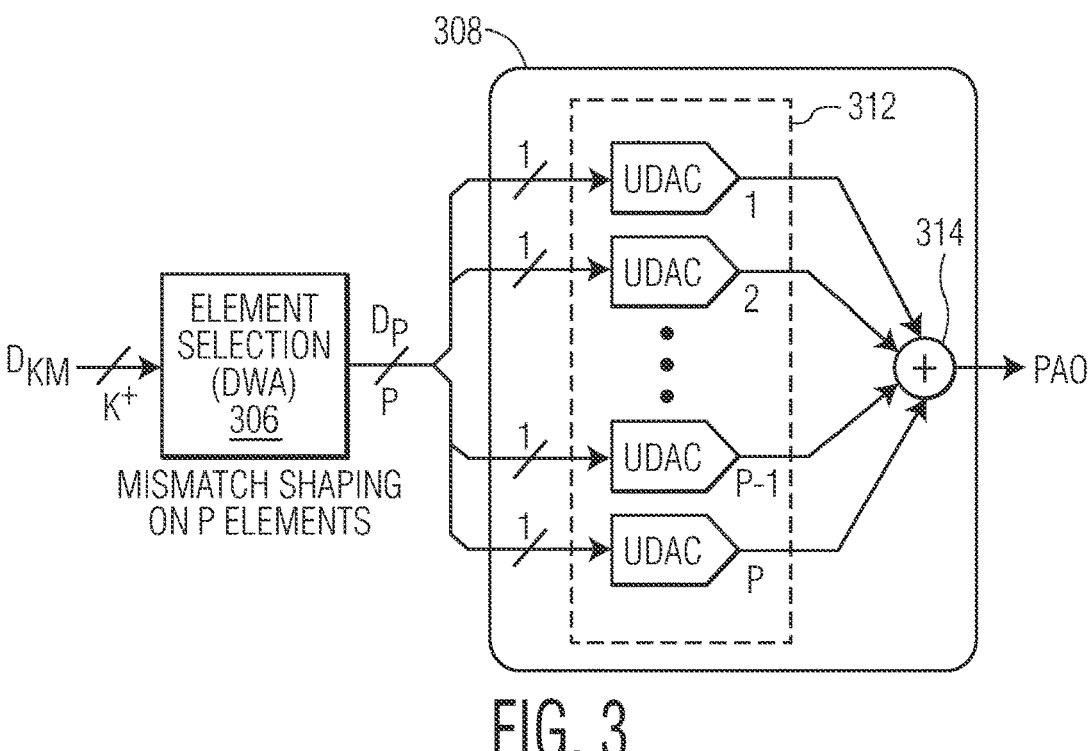
FIG. 3 is a simplified block diagram of an element selection circuit coupled to a P-element DAC according to one embodiment.

FIG. 3 is a simplified block diagram of an element selection circuit 306 coupled to a P-element DAC 308 according to one embodiment. The element selection circuitry 306 is an implementation of the DEM circuit 106 that performs mismatch shaping on the P elements of the DAC 308 according to a data-weighted averaging (DWA) algorithm. It is noted that any suitable DEM technique may be used, which includes many different DWA algorithms including the illustrated DWA technique. The DAC 308 is an implementation of the DAC 108 including an array of P unit or unary DACs (UDACs) 312, numbered from 1 to P (i.e., 1, 2, . . . , P−1, P), and an output adder 314 that sums the outputs of the DACs 312 to develop PAO. In the illustrated embodiment, each unary DAC 312 outputs either a positive or a negative unit value based on the corresponding binary input value, such as a positive or negative unit current value or unit voltage value. An alternative embodiment may output either a zero (or null) value when not selected or output a positive or negative value at the cost of linearity. Another alternative embodiment is a return-to-zero (RTN) setup in which the output is one of three states, positive, negative, or zero.

The set of selected unit values are summed together by the output adder to form the analog output value PAO in each cycle. Generally speaking, the digital value of $D_{KM}$ determines the number of the P elements of the DAC 308 to select in any given cycle, which is decoded from a binary value into a thermometer select value $D_P$. Each of the selected DAC elements contributes 1/P of the full-range value of PAO in each cycle. The unit outputs of the selected DACs are summed together by the output adder 314 in each cycle to develop the value of PAO. The DWA algorithm determines which of the P elements are selected in each cycle, in which the selection changes from cycle to cycle according to the DWA algorithm to avoid favoring any particular one or any particular group of the DACs 312 over time. The DWA algorithm effectively averages the selection of DAC elements in such a manner so that each the P elements are equally weighted over time to minimize mismatch errors between the DACs 312. Various DWA algorithms may be used, such as cyclical selection or random or pseudo random selection or the like.

Figure 4:
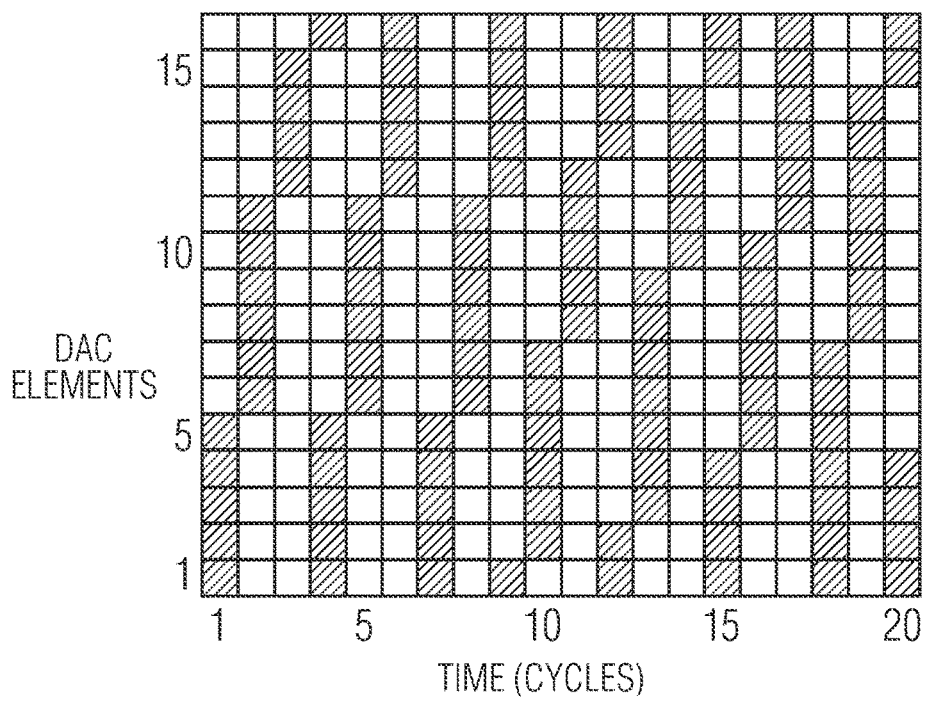
FIG. 4 is a simplified illustration of a data-weighted averaging (DWA) algorithm that may be used by the element selection circuit of FIG. 3 according to one embodiment.

FIG. 4 is a simplified illustration of a DWA algorithm that may be used by the element selection circuit 306 according to one embodiment. DAC element numbers are distributed along the vertical axis versus time in cycles plotted on the horizontal axis in which shaded element numbers indicate selection of specific DAC elements. Since P may be a relatively large number (e.g., 65), the total DAC number shown in FIG. 4 is simplified for purposes of illustration by being reduced to only 16 elements, numbered 1 to 16. It is understood, however, that the reduced number represents the total number P of the DAC elements in the simplified depiction. The number of shaded elements in each cycle is determined by the input value $D_{KM}$ which ranges from 1 to 16 in the simplified illustration. Time is plotted in cycles, which may be clock cycles or sequential time intervals.

In the first cycle (1), the input value $D_{KM}$ corresponds with a selection of 5 DAC elements (or just "elements"), in which the first 5 elements numbered 1 to 5 are shaded to indicate the particular DAC elements selected in the first cycle. In the second cycle (2), the input value $D_{KM}$ corresponds with a selection of 6 elements. Instead of beginning again with the first element 1 in cycle (2), the next 6 elements numbered 6 to 11 are shaded to indicate the particular DAC elements selected in the second cycle. In the third cycle (3), the input value $D_{KM}$ corresponds with a selection of 4 elements, so that the next 4 elements numbered 12 to 15 are selected. In the fourth cycle (4), the input value $D_{KM}$ corresponds with a selection of 6 elements. Beginning from where the last cycle (3) left off, the last element numbered 16 is selected along with the first 5 elements numbered 1 to 5. Thus, for cycle 4, since the last element 16 has been reached, selection cycles or wraps around back to the beginning to continue the selection. The next cycle (5) is similar to the second cycle (2) in which the next 6 elements numbered 6 to 11 are selected. The next cycle (6) includes 5 elements so that the next 6 elements numbered 12 to 16 are selected including the last element. The next cycle (7) is similar to cycle (1) to select 5 elements in which selection wraps around to the beginning, so that elements 1 to 5 are selected. Operation continues in this manner for subsequent cycles.

It is appreciated that given the cyclical selection of DAC elements over time as illustrated in FIG. 4, selection of each of the DAC elements is averaged over time so that each of the DAC elements are substantially equally weighted. As shown, for example the first 4 DAC elements numbered 1 to 4 are each selected 8 times over 20 cycles, whereas the remaining 12 DAC elements numbered 5 to 16 are each selected 7 times over the same 20 cycles. The difference between 7 and 8 is not considered to be significant in the simplified illustration; in addition, over time and a corresponding large number of cycles, such discrepancies are consequentially minimized. For example, after hundreds or thousands or millions of cycles in which the selected number of DAC elements ranges between 1 and 16, any such discrepancies either disappear or are considered negligible. The same is true to an even greater degree for a larger number of DAC elements, such as 65 DAC elements or more, in which discrepancies disappear or become negligible even more quickly over time.

The DWA algorithm shown in FIG. 4 is a cyclical selection algorithm that may be implemented using relatively modest circuitry or logic or the like. In one alternative embodiment, a random or pseudo-random generator may be used to randomize selection of the DAC elements in each cycle. In other alternative embodiments, other equalization weighting algorithms may be employed.

Figure 5:
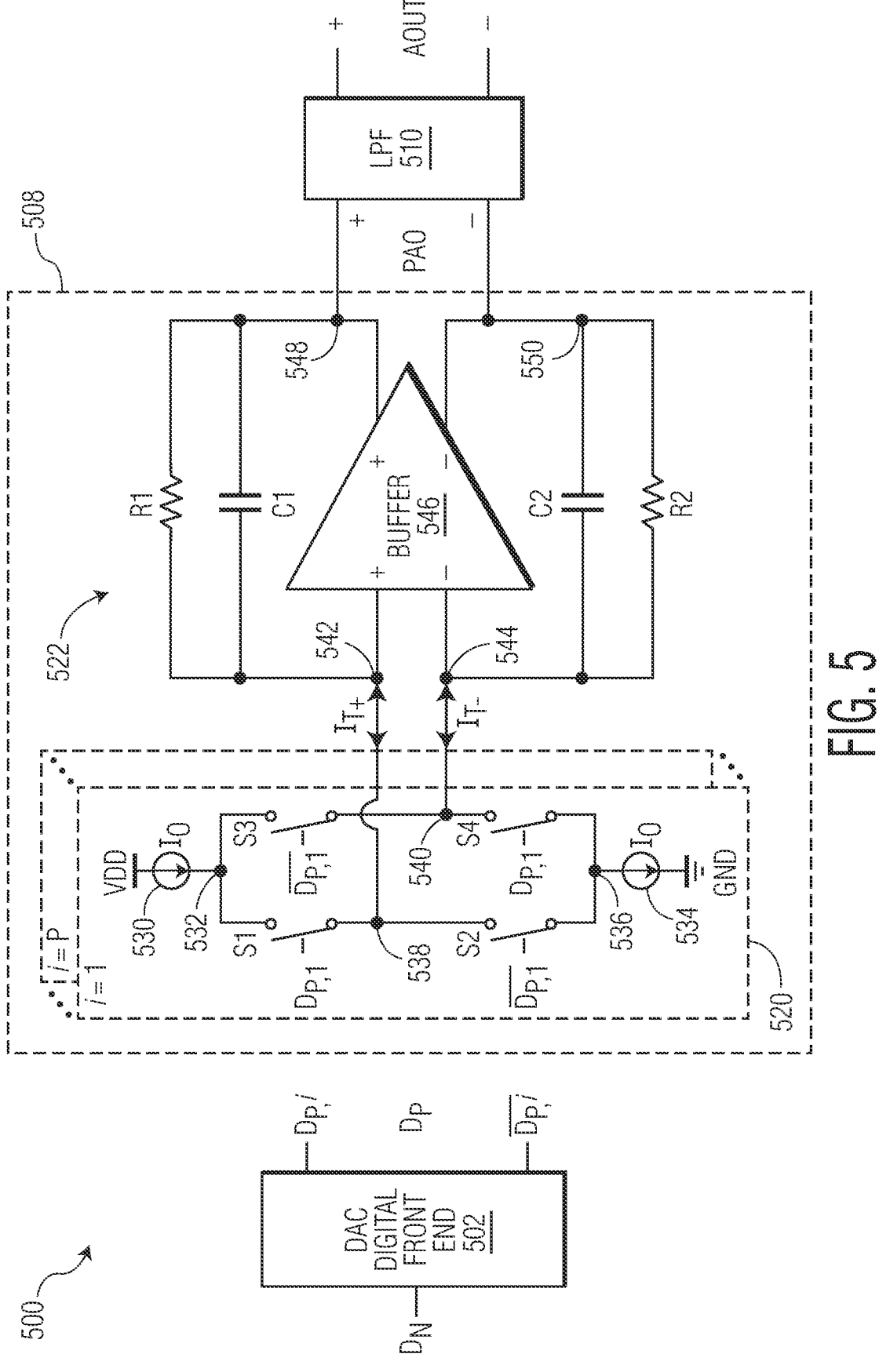
FIG. 5 is a simplified schematic and block diagram of a DAC for implementing the DAC of FIG. 1 including details of a P-element DAC for implementing the P-element DAC of FIG. 1 according to one embodiment.

FIG. 5 is a simplified schematic and block diagram of a DAC 500 for implementing the DAC 100 including details of a P-element DAC 508 for implementing the DAC 108 according to one embodiment. The DAC 500 includes a DAC digital front end 502 receiving the input value $D_N$ and providing the $D_P$ values as complementary binary signals $D_{P,i}$ and $\overline{D_{P,i}}$, the DAC 508 receiving the $D_{P,i}$ and $\overline{D_{P,i}}$ values and having an output providing PAO in the form of a differential signal, and an LPF 510 having an input receiving PAO and an output providing AOUT also in the form of a differential signal. The DAC digital front end 502 may include a DSM and an adder (not shown), which may be the same or which may otherwise be configured to operate in a substantially similar manner as the DSM 102 and the adder 104 for receiving the input value $D_N$ and for providing the sum value $D_{KM}$. The DAC digital front end 502 may also include a DEM which may be similar to or configured to operate in a similar manner as the DEM 106 or the element selection circuit 306 previously described. The internal DEM of the DAC digital front end 502 receives the sum value $D_{KM}$ and provides $D_P$, which in this case is configured to operate as a set of digital control values as further described herein. The LPF 510 is a differential implementation of the LPF 110.

In the illustrated embodiment, the digital front end 502 provides $D_P$ as the set of P complimentary binary signals $D_{P,i}$ and $\overline{D_{P,i}}$, in which "i" is an index from 1 to P and in which each pair of complementary $D_{P,i}$ and $\overline{D_{P,i}}$ values are binary compliments of each other. For example, when $D_{P,1}$ (for i=1) is a binary "1" value, then $\overline{D_{P,1}}$ is a binary "0" value and vice-versa. In this manner, selected ones of the P $D_{P,i}$ values are output as logic "1" values while the remaining non-selected ones of the P $D_{P,i}$ values are output as logic "0" values, while the corresponding complementary $\overline{D_{P,i}}$ values of selected ones of the $D_{P,i}$ values are output as logic "1" values while the remaining complementary $\overline{D_{P,i}}$ values of non-selected ones of the $D_{P,i}$ values are output as logic "0" values. The DEM within the DAC digital front end 502 operates in a similar manner as the element selection circuit 306 using DWA or the like as previously described, in which a number of the $D_P$ values are selected each cycle based on the sum value $D_{KM}$ and selection rotates for averaging and mismatch shaping of the P elements as previously described.

The DAC 508 includes a set of P current-steering circuits 520 and a common summing buffer circuit 522. The P current-steering circuits 520 are numbered based on the index "i" from 1 to P, each receiving and controlled by a corresponding pair of complementary $D_{P,i}$ and $\overline{D_{P,i}}$ values. Thus, for example, a first current-steering circuit i=1 receives and is controlled by complementary values $D_{P,1}$ and $\overline{D_{P,1}}$, a second current-steering circuit i=2 receives and is controlled by complementary values $D_{P,2}$ and $\overline{D_{P,2}}$, and so on up to the last current-steering circuit i=P, which receives and is controlled by complementary values $D_{P,P}$ and $\overline{D_{P,P}}$. The details of the first current-steering circuit 520 (i=1) are shown, in which it is understood that the remaining current-steering circuit 520 numbered i=2–P are each configured in substantially the same manner.

The first current-steering circuit 520 (i=1) includes a current source 530 having an input coupled to a supply voltage VDD and an output coupled to drive a unit current $I_0$ to an upper node 532, and a current sink 534 having an input coupled to a lower node 536 and an output coupled to sink the unit current $I_0$ from the lower node 536 to a supply voltage reference, such as ground (GND). A first switch S1 has switched terminals coupled between the upper node 532 and a first intermediate node 538 and has a control terminal receiving $D_{P,1}$, and a second switch S2 has switched terminals coupled between the first intermediate node 538 and the lower node 536 and has a control terminal receiving $\overline{D_{P,1}}$. Similarly, a third switch S3 has switched terminals coupled between the upper node 532 and a second intermediate node 540 and has a control terminal receiving $\overline{D_{P,1}}$, and a fourth switch S4 has switched terminals coupled between the second intermediate node 540 and the lower node 536 and has a control terminal receiving $D_{P,1}$. Each of the switches S1-S4 are each depicted using simplified switch symbols, but may be implemented using transistors devices or the like. In one embodiment, each of the switches S1-S4 is opened when its corresponding control signal is logic "0", and is closed when its corresponding control signal is logic "1".

In operation of the first current-steering circuit 520 (for i=1), when $D_{P,1}$ is 1 so that $\overline{D_{P,1}}$ is 0, switches S1 and S4 are closed while switches S2 and S3 are opened so that the current source 530 sources the unit current $I_0$ to the first intermediate node 538, and the current sink 534 sinks the unit current $I_0$ from the second intermediate node 540 to GND. Also, when $D_{P,1}$ is 0 so that $\overline{D_{P,1}}$ is 1, switches S1 and S4 are opened while switches S2 and S3 are closed so that the current source 530 sources the unit current $I_0$ to the second intermediate node 540, and the current sink 534 sinks the unit current $I_0$ from the first intermediate node 538 to GND.

As previously stated, each of the P current-steering circuits 520 are configured in substantially the same manner, so that each includes a current source (e.g., 530) sourcing the unit current $I_0$ to an upper node (e.g., 532) and a current sink (e.g., 534) sinking the unit current $I_0$ from a lower node (e.g., 536) to GND and four switches (e.g., S1-S4) that are controlled by corresponding values $D_{P,i}$ and $\overline{D_{P,i}}$ in substantially the same manner. The first intermediate node (e.g., 538) of each of the P current-steering circuits 520 are coupled together at an upper summing junction node 542, and the second intermediate node (e.g., 540) of each of the P current-steering circuits 520 are coupled together at a lower summing junction node 544. Node 542 is coupled to a first (e.g., positive) input of a buffer amplifier 546, to one end of a resistor R1, and to one end of a capacitor C1. Node 544 is coupled to a second (e.g., negative) input of the buffer amplifier 546, to one end of a resistor R2, and to one end of a capacitor C2. The other ends of R1 and C1 are coupled together to a positive output node 548, which is further coupled to a first (e.g., positive) output terminal of the buffer amplifier 546. The other ends of R2 and C2 are coupled together to a negative output node 550, which is further coupled to a second (e.g., negative) output terminal of the buffer amplifier 546. The output nodes 548 and 550 form positive and negative polarities of the differential signal PAO provided to respective inputs of the LPF 510, which outputs differential signal AOUT.

The DAC digital front end 502 outputs a new set of $D_P$ signals each cycle, which are converted by the set of P current-steering circuits 520 into a sum of P source or sink currents flowing into and out of each of the intermediate nodes 538 and 540 developing a first current $I_{T+}$ shown flowing through the upper summing junction node 542, and a second current $I_{T-}$ shown flowing through the lower summing junction node 544. It is appreciated, of course, that each of the $I_{T+}$ and $I_{T-}$ are bidirectional currents having a magnitude and direction based on the sum of source and sink currents developed by the P current-steering circuits 520 as controlled by the set of $D_P$ signals for each cycle and may flow in either direction. In each cycle in which $D_P$ is updated, a new pair of bidirectional $I_{T+}$ and $I_{T-}$ currents are developed. A sequential series of $I_{T+}$ and $I_{T-}$ bidirectional current pairs is converted by the summing buffer circuit 522 into the preliminary analog output signal PAO, which in this case is a differential voltage that varies over time based on the digital input value $D_N$. The LPF 510 filters out higher frequency noise above the target signal band of the preliminary analog output signal PAO to provide the filtered analog output signal AOUT, which is also a differential voltage.

It is noted that the buffer circuit 522 including the summing junction nodes 542 and 544 buffered by the buffer amplifier 546 and including the feedback resistor-capacitor configuration including the resistors and capacitors R1, R2, C1, and C2 collectively operates as a first order LPF. In this manner, the order of the LPF 510 may be reduced from Q+1 to Q.

Figure 6:
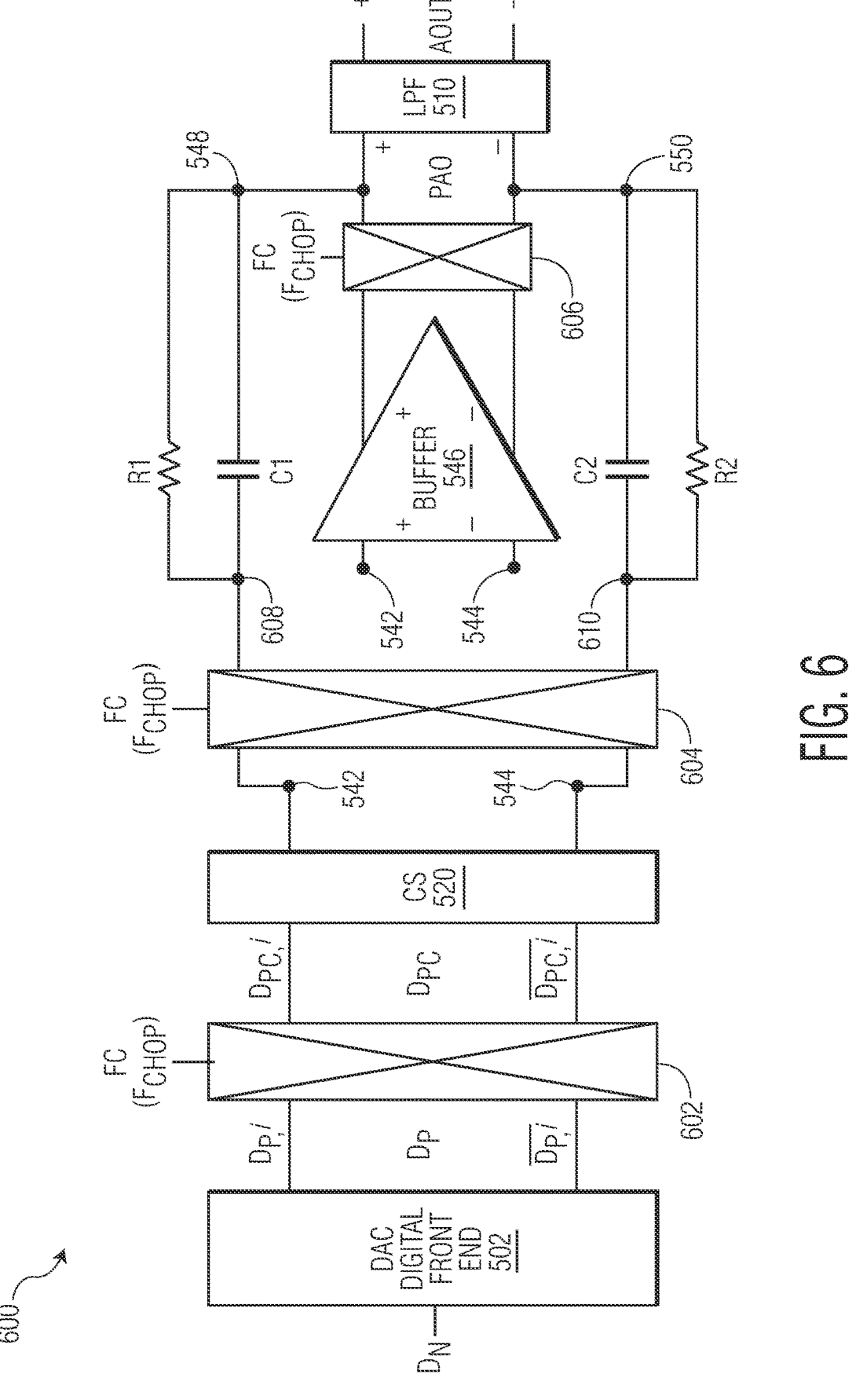
FIG. 6 is a simplified schematic and block diagram of a DAC including chopping that is substantially similar to the DAC of FIG. 5 according to another embodiment.

FIG. 6 is a simplified schematic and block diagram of a DAC 600 including chopping that is substantially similar to the DAC 500 according to another embodiment. The DAC 600 also includes the DAC digital front end 502, the current-steering circuits 520, the buffer amplifier 546, the LPF 510, the resistors R1 and R2, and the capacitors C1 and C2 that are coupled to operate in substantially the same manner as described for the DAC 500. The DAC 600 further includes chop circuits 602, 604, and 606 that are interposed in various places as shown and as further described herein. Each of the chop circuits 602, 604, and 606 includes a pair of inputs and a corresponding pair of outputs and each receives and operates using a chop signal FC having a chop frequency $F_{CHOP}$. In general, each of the chop circuits 602, 604, and 606 swap its inputs between its outputs at a rate of the $F_{CHOP}$ frequency of the FC signal. The inclusion of chopping performed by the chop circuits 602, 604, and 606 increases linearity of the current-steering circuits 520 and improves noise performance by moving flicker noise (1/f) from the buffer amplifier 546 and associated circuitry to higher frequencies out of the desired signal band. The higher frequency noise is then filtered by the low-pass filtering at the output.

The chopping circuit 602 is interposed between the DAC digital front end 502 and the current-steering circuits 520, in which the pair of complimentary binary signals $D_{P,i}$ and $\overline{D_{P,i}}$ provided to the pair of inputs of the chopping circuit 602 are chopped to provide a corresponding pair of chopped complimentary binary signals $D_{PC,i}$ and $\overline{D_{PC,i}}$ at the pair of outputs of the chopping circuit 602. Rather than $D_{P,i}$ and $\overline{D_{P,i}}$, the chopped complimentary binary signals $D_{PC,i}$ and $\overline{D_{PC,i}}$ are instead provided to the corresponding pair of inputs of the current-steering (CS) circuits 520. The pair of outputs of the CS circuits 520 are provided to the upper and lower summing junction nodes 542 and 544, which are provided to the positive and negative inputs, respectively, of the buffer amplifier 546 in a similar manner as described for the DAC 500. The resistor R1 and capacitor C1 coupled together at the upper summing junction node 542 for the DAC 500 are instead coupled together at a separate node 608, and the resistor R2 and capacitor C2 coupled together at the lower summing junction node 544 for the DAC 500 are instead coupled together at a separate node 610. The upper and lower summing junction nodes 542 and 544 are further provided to the pair of inputs of the chop circuit 604, having its pair of outputs coupled to the nodes 608 and 610, respectively. The positive and negative outputs of the buffer amplifier 546 are not coupled to the positive and negative output nodes 548 and 550 as shown for the DAC 500, but instead are coupled to the pair of inputs of the chop circuit 606 for the DAC 600. The outputs of the chop circuit 606 are coupled to the positive and negative output nodes 548 and 550, respectively, which are coupled to the pair of inputs of the LPF 510 in a similar manner as the DAC 500. The other ends of the resistor R1 and capacitor C1 are coupled to the positive output node 548 and the other ends of the resistor R2 and capacitor C2 are coupled to the negative output node 550 in similar manner.

Operation of the DAC 600 is substantially similar to operation of the DAC 500, in which the digital input value $D_N$ provided to the input of the DAC digital front end 502 is converted to the differential analog output value AOUT provided at the output of the LPF 510. Again, the inclusion of chopping performed by the chop circuits 602, 604, and 606 increases linearity and improves noise performance of the DAC 600 as compared to the DAC 500 as previously described. The buffer circuit 522 forming a first order LPF filters the upconverted flicker noise (1/f). Also, the summing junctions and collective configuration of the buffer amplifier 546 of the DAC 600 also operate as a first order LPF, so that the order of the LPF 510 may be reduced from Q+1 to Q.

Figure 7:
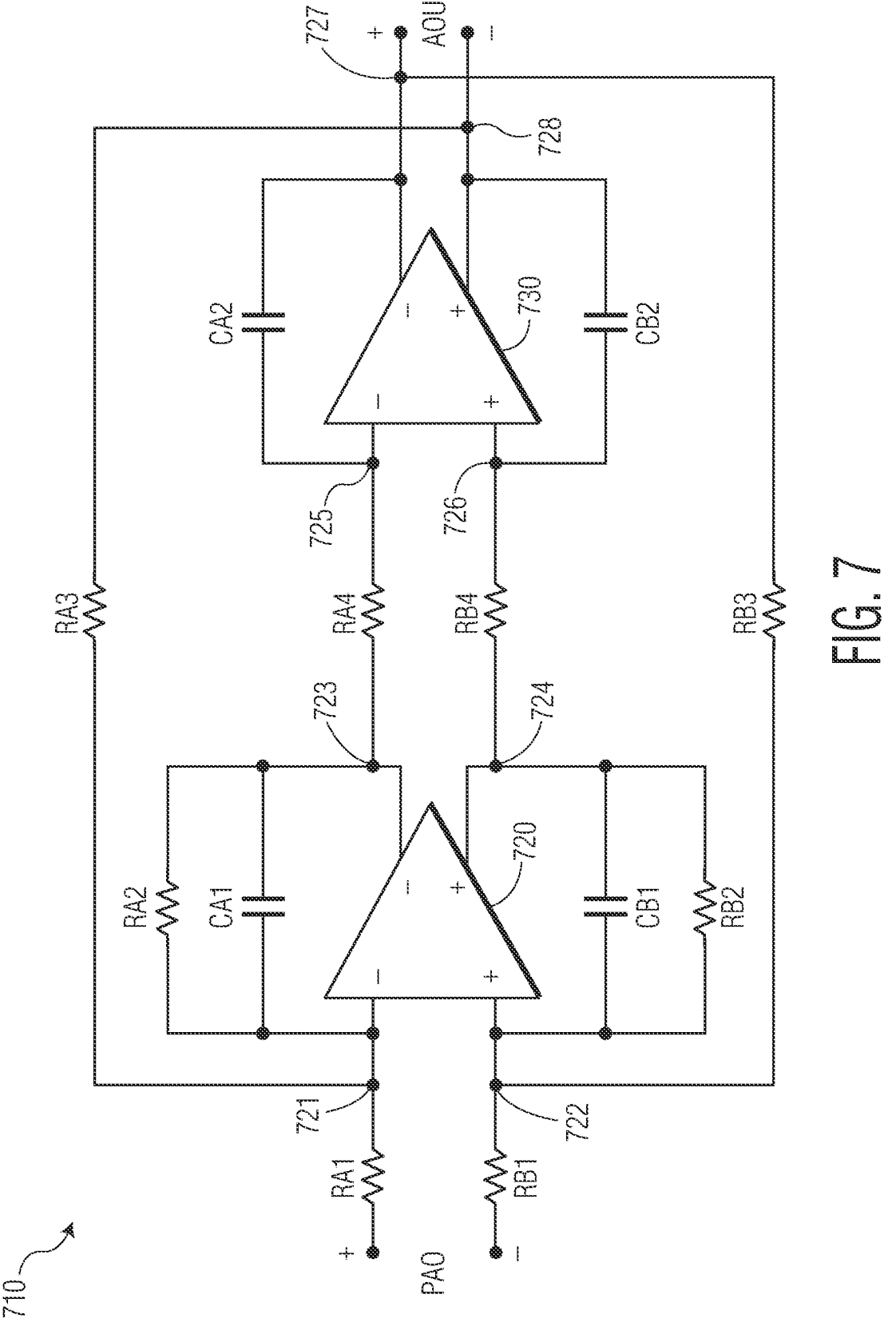
FIG. 7 is a schematic diagram of an LPF that may be used as the LPF of FIG. 5 according to one embodiment.

FIG. 7 is a schematic diagram of an LPF 710 that may be used as the LPF 510 according to one embodiment. The illustrated LPF 710 is only one example of many different types of LPF configurations that may be used. The LPF 710 is a second-order biquad LPF (Q=2) suitable for use by either of the DACs 500 or 600 including buffering which inherently includes a first order LPF. For configurations in which the DSM 102 is a second order DSM (Q=2) and DAC circuitry before the output LPF does not include a first order LPF, then a third order LPF (Q=3) may be used instead. The LPF 710 includes a pair of differential amplifiers (diff amps) 720 and 730, a set of resistors RA1, RA2, RA3, RA4, RB1, RB2, RB3, and RB4 and a set of capacitors CA1, CA2, CB1, and CB2. The LPF 710 may have a symmetric configuration in which the resistors RA1 and RB1 have substantially the same resistance, the resistors RA2 and RB2 have substantially the same resistance, the resistors RA3 and RB3 have substantially the same resistance, the resistors RA4 and RB4 have substantially the same resistance, the capacitors CA1 and CB1 have substantially the same capacitance, and the capacitors CA2 and CB2 have substantially the same capacitance.

The positive polarity of PAO is provided through RA1 to a node 721 which is further coupled to a negative input of the diff amp 720 and to one end each of CA1, RA2, and RA3. The other ends of CA1 and RA2 are coupled to a node 723, which is coupled to a negative output of diff amp 720. The other end of RA3 is coupled to an output node 728 developing the negative polarity of AOUT. RA4 is coupled between node 723 and a node 725, which is further coupled to a negative input of the diff amp 730 and to one end of CA2. The other end of CA2 is coupled to the output node 727 developing the positive polarity of AOUT. In a similar manner, the negative polarity of PAO is provided through RB1 to a node 722 which is further coupled to a positive input of the diff amp 720 and to one end each of CB1, RB2, and RB3. The other ends of CB1 and RB2 are coupled to a node 724, which is coupled to a positive output of diff amp 720. The other end of RB3 is coupled to the output node 727. RB4 is coupled between node 724 and a node 726, which is further coupled to a positive input of the diff amp 730 and to one end of CB2. The other end of CB2 is coupled to the output node 728.

The illustrated LPF 710 is exemplary only in which the particular implementation may depend upon the particular signal bandwidth and the application. For audio applications, a passive inductor-capacitor (LC) filter may be included, similar to what might be used for class-D amplifiers. The LC filter may be implemented off-chip. When a monolithic solution is desired in which all of the components are provided on the same chip, an active filter may be used. Also, the order of the LPF may be increased by one when the corresponding implementation of the DAC 108 does not include a first-order LPF.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A digital to analog converter, comprising:
an oversampling delta sigma modulator configured to modulate a digital value $D_{N-K}$ to provide an M-bit quantized value $D_M$, wherein $D_{N-K}$ comprises N–K least significant bits of an N-bit digital input value $D_N$;
an adder configured to add the $D_M$ value to a digital value $D_K$ to provide a digital select value $D_{KM}$, wherein the $D_K$ value comprises the K remaining most significant bits of the $D_N$ value; and
dynamic element matching circuitry configured to apply mismatch shaping of a total of at least $P=2^K$ elements of a P-element digital to analog converter (DAC) per cycle based on the $D_{KM}$ value, wherein the P-element DAC provides an analog output value;

wherein:

the dynamic element matching circuitry is configured to output a set of P complementary binary signals each having a first state when selected or a second state when not selected; and wherein the P-element DAC comprises:

a parallel set of P current-steering circuits, each configured to be controlled by a corresponding one of the set of P complementary binary signals to provide a corresponding one of a set of P bidirectional current signal pairs; and summing buffer circuitry having a summing input configured to sum outputs of the set of P bidirectional current signal pairs and an output providing the analog output value as a differential signal.

2. The digital to analog converter of claim 1, wherein the delta sigma modulator is configured as a Q order delta sigma modulator configured to shape quantization error to a higher frequency above a signal band of interest in which Q is at least one; and further comprising a low-pass filter with an order of at least Q+1 configured to filter the analog output value to provide a filtered analog output value.

3. The digital to analog converter of claim 1, wherein the delta sigma modulator includes a quantizer comprising a multibit comparator providing $D_M$ as a multibit output in which M is greater than 1.

4. The digital to analog converter of claim 1, wherein $P=2^{K+(M-2)}+2^{M-1}-1$.

5. The digital to analog converter of claim 1, wherein the dynamic element matching circuitry is configured to select $D_{KM}$ elements from among a total of the P elements of the P-element DAC per cycle based on a data-weighted averaging algorithm to provide the analog output value based on a sum of selected elements.

6. The digital to analog converter of claim 1, wherein the P-element DAC comprises:

a parallel set of P unary DACs; and an adder configured to add outputs of selected ones of the set of P unary DACs per cycle to provide the analog output value.

7. The digital to analog converter of claim 1, wherein each P current-steering circuit comprises:

a current source configured to provide a nominal current level to an upper node;

a current sink configured to sink the nominal current level from a lower node;

a first switch coupled between the upper node and a first intermediate node, wherein the first switch is controlled by a first bit of a corresponding one of the set of P complementary binary signals;

a second switch coupled between the first intermediate node and the lower node, wherein the second switch is controlled by a second bit of the corresponding one of the set of P complementary binary signals;

a third switch coupled between the upper node and a second intermediate node, wherein the third switch is controlled by the second bit of the corresponding one of the set of P complementary binary signals; and a fourth switch coupled between the second intermediate node and the lower node, wherein the second switch is controlled by the first bit of the corresponding one of the set of P complementary binary signals;

wherein the first intermediate node develops a first bidirectional current signal and the second intermediate node develops a second bidirectional current signal of a corresponding one of the set of P bidirectional current signal pairs.

8. The digital to analog converter of claim 1, wherein the summing buffer circuitry comprises:

a differential buffer amplifier having a first input coupled to a first intermediate node of each of the P current-steering circuits, having a second input coupled to a second intermediate node of each of the P current-steering circuits, a first output providing a first polarity of the analog output value, and a second output providing a second polarity of the analog output value;

a first resistor-capacitor circuit coupled between the first input and the first output of the differential buffer amplifier; and a second resistor-capacitor circuit coupled between the second input and the second output of the differential buffer amplifier.

9. The digital to analog converter of claim 8, wherein the summing buffer circuitry comprises a first order low-pass filter, wherein the delta sigma modulator is configured as a second-order multibit delta sigma modulator, further comprising a low-pass filter configured as a second-order low-pass filter to filter the analog output value to provide a filtered analog output value.

10. A method of digital to analog conversion, comprising:

modulating a digital value $D_{N-K}$ with an oversampling delta sigma modulator to provide an M-bit coarse quantized value $D_M$, wherein $D_{N-K}$ comprises N–K least significant bits of an N-bit digital input value $D_N$;

adding the $D_M$ value to a digital value $D_K$ to provide a digital select value $D_{KM}$, wherein the $D_K$ value comprises the K remaining most significant bits of the $D_N$ value; and applying mismatch shaping of a total of at least $P=2^K$ elements of a P-element digital to analog converter (DAC) per cycle based on the $D_{KM}$ value and providing an analog output value;

wherein the applying mismatch shaping comprises:

using a data-weighted averaging algorithm for selecting $D_{KM}$ elements from among a total of the P elements of the P-element DAC per cycle; and summing outputs of selected elements for providing the analog output value;

wherein the using a data-weighted averaging algorithm comprises outputting a set of P complementary binary signals each having a first state when selected or a second state when not selected;

wherein the selecting comprises controlling each of a parallel set of P current-steering circuits by a corresponding one of the set of P complementary binary signals for providing a corresponding one of a set of P bidirectional current signal pairs; and wherein the summing outputs comprises summing outputs of the set of P bidirectional current signal pairs for providing the analog output value as a differential signal.

11. The method of claim 10, wherein the modulating comprises modulating with the delta sigma modulator configured as a Q order delta sigma modulator in which Q is at least one for shaping quantization error to a higher frequency above a signal band of interest; and further comprising low-pass filtering at an order of at least Q+1 to filter the analog output value to provide a filtered analog output value.

12. The method of claim 10, wherein the quantizing comprises comparing using a multibit comparator and providing $D_M$ as a multibit output in which M is greater than 1.

13. The method of claim 10, wherein the applying mismatch shaping comprises applying mismatch shaping of $P=2^{K+(M-2)}+2^{M-1}-1$ elements of the P-element DAC.

14. The method of claim 10, wherein the applying mismatch shaping comprises:

selecting $D_{KM}$ DACs from a parallel set of P unary DACs per cycle based on the data-weighted averaging algorithm; and adding outputs of selected ones of the set of P unary DACs per cycle to provide the analog output value.

15. The method of claim 10, wherein the controlling each of a parallel set of P current-steering circuits by a corresponding one of the set of P complementary binary signals comprises:

when selected, sourcing a nominal current to a first current node and sinking the nominal current from a second current node for providing a first bidirectional current of the corresponding one of a set of P bidirectional current signal pairs; and when not selected, sourcing a nominal current to the second current node and sinking the nominal current from the first current node for providing a second bidirectional current of the corresponding one of a set of P bidirectional current signal pairs.

16. The method of claim 10, wherein the summing outputs comprises:

coupling a first current node of each of a parallel set of P current-steering circuits to a first summing node;

coupling a second current node of each of a parallel set of P current-steering circuits to a second summing node; and buffering the first and second nodes through inputs of a differential buffer amplifier with resistor-capacitor feedback circuitry for providing the analog output value as a differential signal at a differential output of the differential buffer amplifier.

17. The method of claim 10, further comprising:

chopping the set of P complementary binary signals at a chopping frequency to provide a set of P chopped complementary binary signals and controlling each of the parallel set of P current-steering circuits by a corresponding one of the set of P chopped complementary binary signals;

chopping the set of P bidirectional current signal pairs at the chopping frequency to provide a set of P chopped binary current signal pairs; and chopping the differential signal at a differential output of a differential buffer amplifier at the chopping frequency.

18. A method of digital to analog conversion, comprising:

modulating a digital value $D_{N-K}$ with an oversampling delta sigma modulator to provide an M-bit coarse quantized value $D_M$, wherein $D_{N-K}$ comprises N–K least significant bits of an N-bit digital input value $D_N$;

adding the $D_M$ value to a digital value $D_K$ to provide a digital select value $D_{KM}$, wherein the $D_K$ value comprises the K remaining most significant bits of the $D_N$ value; and applying mismatch shaping of a total of at least $P=2^K$ elements of a P-element digital to analog converter (DAC) per cycle based on the $D_{KM}$ value and providing an analog output value;

wherein the applying mismatch shaping comprises:

selecting $D_{KM}$ elements from among a total of the P elements of the P-element DAC per cycle; and summing outputs of selected elements for providing the analog output value;

wherein the applying mismatch shaping comprises outputting a set of P complementary binary signals each having a first state when selected or a second state when not selected;

wherein the selecting comprises controlling each of a parallel set of P current-steering circuits by a corresponding one of the set of P complementary binary signals for providing a corresponding one of a set of P bidirectional current signal pairs; and wherein the summing outputs comprises summing outputs of the set of P bidirectional current signal pairs for providing the analog output value as a differential signal.

* * * * *